US012221719B2

(12) United States Patent
Iyer et al.

(10) Patent No.: US 12,221,719 B2
(45) Date of Patent: Feb. 11, 2025

(54) HIGH Sb CONCENTRATION GaAsSb/GaAs$_{(1-x)}$Sb$_x$N/GaAlAs CORE-SHELL-SHELL NANOWIRES

(71) Applicant: North Carolina A&T State University, Greensboro, NC (US)

(72) Inventors: Shanthi Iyer, Greensboro, NC (US); Jia Li, Greensboro, NC (US); Prithviraj Deshmukh, Hillsboro, OR (US); Manish Sharma, Hillsboro, OR (US)

(73) Assignee: North Carolina A&T State University, Greensboro, NC (US)

( * ) Notice: Subject to any disclaimer, the term of this patent is extended or adjusted under 35 U.S.C. 154(b) by 0 days.

(21) Appl. No.: 18/425,387

(22) Filed: Jan. 29, 2024

(65) Prior Publication Data
US 2024/0218563 A1    Jul. 4, 2024

Related U.S. Application Data

(63) Continuation of application No. 17/229,066, filed on Apr. 13, 2021, now Pat. No. 11,905,622.

(60) Provisional application No. 63/009,672, filed on Apr. 14, 2020.

(51) Int. Cl.
*C30B 29/40*    (2006.01)
*C30B 23/02*    (2006.01)
*C30B 29/60*    (2006.01)

(52) U.S. Cl.
CPC ............ *C30B 29/403* (2013.01); *C30B 23/02* (2013.01); *C30B 29/40* (2013.01); *C30B 29/605* (2013.01)

(58) Field of Classification Search
CPC ......... B82Y 20/00; B82Y 30/00; B82Y 40/00; C09K 11/7492; C09K 11/75; C30B 23/007; C30B 29/42; C30B 29/62; C30B 29/68; C30B 23/02; C30B 29/40; C30B 29/403; C30B 29/60; C30B 29/605; Y10S 977/762; Y10S 977/896; Y10S 977/95
See application file for complete search history.

(56) References Cited

U.S. PATENT DOCUMENTS 11,905,622 B2 *  2/2024  Iyer ................... C30B 29/60
2017/0130363 A1 *  5/2017  Iyer ..................... C09K 11/75

\* cited by examiner

*Primary Examiner* — Lynda Salvatore
(74) *Attorney, Agent, or Firm* — Fox Rothschild LLP

(57) ABSTRACT

Compositions comprising Group V/III nanowires, and methods of making such nanowires are described. Some compositions comprise one or more core-shell nanowires comprising a core and a first shell surrounding or substantially surrounding the core. The core is formed from GaAs$_{(1-y)}$Sb$_y$, where y=about 0.03-0.07 and the first shell is formed from GaAs$_{(1-x)}$Sb$_x$N, where x=0.27-0.34. The nanowires have an average emission maximum of 1.4-1.7 μm. Some nanowires further comprise a second shell surrounding or substantially surrounding the first shell. The second shell is formed from a Group V/III material such as Ga$_{1-m}$Al$_m$As, where m=0-0.2. Some nanowires have the structure GaAs$_{(0.93-0.97)}$Sb$_{(0.03-0.07)}$/GaAS$_{(0.66-0.73)}$Sb$_{(0.27-0.34)}$N/Ga$_{(0.8-1)}$Al$_{(0-0.2)}$As.

22 Claims, 10 Drawing Sheets

HIGH Sb CONCENTRATION GaAsSb/GaAs$_{(1-x)}$Sb$_x$N/GaAlAs CORE-SHELL-SHELL NANOWIRES

PRIORITY CLAIM

This application claims the priority benefit of U.S. Provisional Patent Application Ser. No. 63/009,672, filed Apr. 14, 2020, the disclosure of which is incorporated herein by reference in its entirety.

STATEMENT AS TO RIGHTS TO INVENTIONS MADE UNDER FEDERALLY SPONSORED RESEARCH OR DEVELOPMENT

This invention was made with Government support under N00014-16-1-2720 awarded by the Office of Naval Research. The Government has certain rights in this invention.

TECHNICAL FIELD

The presently disclosed subject matter relates generally to GaAsSb/GaAsSbN core-shell nanowires (NWs) having a large contribution from Sb in the first shell, to methods of growing such nanowires, such as molecular beam epitaxy (MBE) and various vapor phase growth mechanisms, and the use of such nanowires in applications such as infrared photodetection, quantum networking applications, and integrated photonic circuits.

BACKGROUND

Significant research has been done in the area of thin films, but the technology of nanowires (NWs) is not as fully developed. It is well known that methodologies of nanowire formation and thin film formation are not readily interchangeable. Although NW devices with promising properties have been recently demonstrated, the NW growth and the NW device fabrication are still very challenging. Due to the small dimension, unique geometry and the special growth modes, NW growth is much more sensitive to the substrate condition and the growth parameters compared with its thin film counterpart. In most cases, the growth window for NW s is very narrow and the NW growth directions, crystal phase, composition and junction are difficult to control. Moreover, for the NW device, the design theories and the fabrication processes are quite different from the traditional thin film device.

Semiconductor nanowires have been identified as ideal candidates for several applications, such as nanophotonic integrated circuits, single-photon emission and detection, photonic waveguides, and nanoscale photodetectors for on-chip quantum information circuits across a range of energies.

Although GaAs/GaAs$_{(1-x-y)}$Sb$_x$N$_y$/GaAs semiconductor wires (where x=0.08-0.15 or 0.10-0.17; and y=0.005-0.035) having emission wavelength maxima up to 1.35 μm are known, for example US Publication No. 2017/0130363A1 to Iyer et al., however, semiconductor nanowires comprising a core that comprises antimony (Sb), such as a GaAsSb core disclosed herein, along with a GaAsSbN first shell, wherein the nanowires have an emission wavelength maxima of greater than 1.35 μm, e.g. wavelengths 1.4 μm-1.7 μm, have not been reported and the preparation of such nanowires is a challenge. Accordingly, Group V/III semiconductor nanowires comprising a high density vertical array of dilute nitride GaAsSb (core)/GaAsSbN (shell) NWs for bandgap tuning in the range from 1.4 μm to 1.7 μm, and methods of making such semiconductor nanowires are desired.

SUMMARY

In one aspect, compositions comprising GaAs$_{(1-y)}$Sb$_y$/GaAs$_{(1-x)}$Sb$_x$(N) core-shell nanowires, and methods of making such nanowires, are described herein which, in some embodiments, exhibit one or more advantages compared to some previous compositions comprising Group V/III nanowires, and compared to some previous methods of making such nanowires. In some instances, a composition described herein comprises core-shell Group V/III semiconductor nanowires.

Described hereinbelow are compositions comprising one or more core-shell nanowires comprising a core and a first shell surrounding or substantially surrounding the core, wherein the core is formed from three elements selected from the group of Group V and Group III elements; and the first shell is formed from four elements selected from the group of Group V and Group III elements. Methods of preparing such nanowire compositions are also described.

In some embodiments the nanowires have an average emission maximum of 1.4-1.7 μm. In some embodiments, the core is formed from Ga, As and Sb; and the first shell is formed from Ga, As, Sb and N. In other embodiments, the core is formed from GaAs$_{(1-y)}$Sb$_y$, where y=about 0.03-0.07; and the first shell is formed from GaAs$_{(1-x)}$Sb$_x$N shell, where x=0.27-0.34. In some embodiments, the core shell nanowire is formed from GaAs$_{0.95}$Sb$_{0.05}$/GaAs$_{0.7}$Sb$_{0.3}$N. In some embodiments the core shell nanowire is formed from GaAs$_{0.97}$Sb$_{0.03}$/GaAs$_{0.73}$Sb$_{0.27}$/Ga$_{0.9}$Al$_{0.1}$As.

In some embodiments, the nanowires further comprise a second shell surrounding or substantially surrounding the first shell, and the second shell is formed from three elements selected from the group of Group V and Group III elements. In still other embodiments, the second shell is formed from Ga, Al and As, including for example Ga$_{1-m}$Al$_m$As, where m=0-0.2. In some variations, the the nanowire has the structure GaAs$_{(0.97-0.93)}$Sb$_{(0.03-0.07)}$/GaAs$_{(0.66-0.73)}$Sb$_{(0.27-0.34)}$N/Ga$_{(0.8-1)}$Al$_{(0-0.2)}$As.

In some variations, the core has an average diameter of 50-110 nm. In other variations, the core has an average diameter of 70-90 nm. In still other variations, the first shell has an average thickness of 30-90 nm or the first shell has an average thickness of 50-80 nm. In some variations, the second shell has an average thickness of at least 5 nm or an average thickness of 10-30 nm. In some variations, the nanowire has an average length of at least 1 μm. In other variations, the nanowire has a straight or substantially straight morphology. In some embodiments, the nanowires have an average length of at least 1 μm. In some variations, the nanowires have an average aspect ratio of at least about 5 or an average aspect ratio of at least about 10. In some variations, the nanowires have a density of at least about 1 μm$^{-2}$. In some variations, the nanowires have a room temperature photoluminescence quantum yield of at least 10%.

In some embodiments, the nanowires are formed by molecular beam epitaxy. Described hereinbelow is a method of growing nanowires comprising vapor phase growth, wherein the growth mechanism can be selected from the group of vapor liquid solid growth, vapor solid growth, vapor solid growth, oxide-assisted growth, chemical vapor deposition, and self-catalytic growth.

Described further hereinbelow are GaAsSb/GaAsSbN core-shell nanowires, comprising a $GaAs_{(1-y)}Sb_y$ core and a $GaAs_{(1-x)}Sb_xN$ shell, where y=0.03-0.07 and x=0.27-0.34. In some embodiments, the core-shell nanowire comprises a second shell, such as, for example, $Ga_{1-m}Al_mAs$, where m=0-0.2. In some embodiments the composition of the second shell is $Ga_{0.9}Al_{0.1}As$. In some embodiments the core-shell nanowires are straight. In some embodiments the core-shell nanowires are substantially straight. Further, the nanowires of the present application have an average emission maximum of up to 1.7 μm at room temperature (23° C.). In some instances, the nanowires have the structure $GaAs_{0.97}Sb_{0.03}/GaAs_{(0.66-0.73)}Sb_{(0.27-0.34)}N/Ga_{0.9}Al_{0.1}As$. Core-shell nanowires described herein may also be annealed.

In some embodiments, the nanowires of a composition have an average length of at least 500 nm, or at least 1 μm or at least 2 μm. In some embodiments, the nanowires have an aspect ratio of at least about 5, at least about 10, or at least about 20, as well as a straight or substantially straight morphology. For instance, in some cases, the nanowires have an average length of at least about 1 μm and an average aspect ratio of at least 10.

In some cases, a composition comprises an array of core-shell nanowires, wherein the core-shell nanowires have the structural properties and/or the optical properties described hereinabove. For instance, in some embodiments, a composition comprises an array of a plurality of core-shell nanowires, each of the core-shell nanowires comprising a core and a first shell surrounding or substantially surrounding the core, wherein the core is formed from $GaAs_{(1-y)}Sb_y$, wherein y is between about 0.03 and about 0.07, wherein the first shell is formed from $GaAs_{(1-x)}Sb_xN$, wherein x is 0.27-0.34, and wherein the nanowires have an average emission maximum of 1.4-1.7 μm at room temperature. In some variations y is about 0.03. In some variations, the array of core-shell nanowires is an ordered array. In some embodiments, the core-shell nanowires of an array are aligned. For example, in some cases, the core-shell nanowires are vertically aligned or substantially vertically aligned, relative to a substrate on which the nanowires are disposed or grown. Additionally, in some embodiments, the array of core-shell nanowires has a high nanowire density.

These and other embodiments are described in greater detail in the detailed description which follows. An object of the presently disclosed subject matter having been stated hereinabove, and which is achieved in whole or in part by the presently disclosed subject matter, other objects will become evident as the description proceeds when taken in connection with the accompanying drawings as described hereinbelow.

DETAILED DESCRIPTION

Figure 1B:
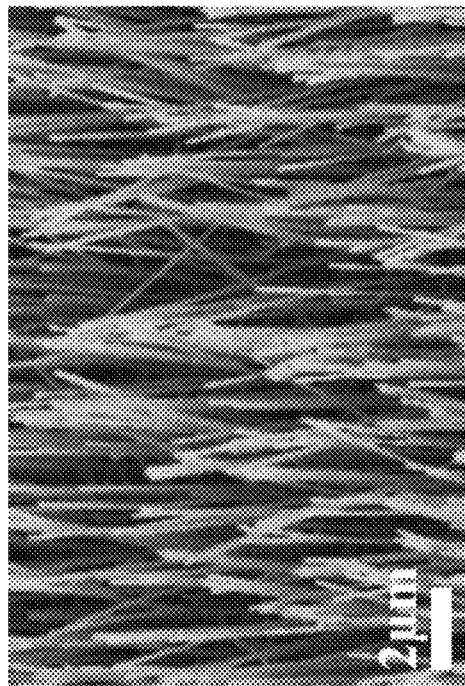
FIG. 1B illustrates an SEM image of $GaAs_{0.95}Sb_{0.05}/GaAs_{0.7}Sb_{0.3}N$ core-shell nanowires under low nitrogen plasma pressure.

The presently disclosed subject matter will now be described more fully. The presently disclosed subject matter can, however, be embodied in different forms and should not be construed as limited to the embodiments set forth herein below and in the accompanying Examples. Rather, these embodiments are provided so that this disclosure will be thorough and complete, and will fully convey the scope of the embodiments to those skilled in the art.

All references listed herein, including but not limited to all patents, patent applications and publications thereof, and scientific journal articles, are incorporated herein by reference in their entireties to the extent that they supplement, explain, provide a background for, or teach methodology, techniques, and/or compositions employed herein.

I. Definitions

While the following terms are believed to be well understood by one of ordinary skill in the art, the following definitions are set forth to facilitate explanation of the presently disclosed subject matter.

Unless defined otherwise, all technical and scientific terms used herein have the same meaning as commonly understood to one of ordinary skill in the art to which the presently disclosed subject matter belongs.

Following long-standing patent law convention, the terms "a" and "an" refer to "one or more" when used in this application, including the claims.

The term "and/or" when used in describing two or more items or conditions, refers to situations where all named items or conditions are present or applicable, or to situations wherein only one (or less than all) of the items or conditions is present or applicable.

The use of the term "or" in the claims is used to mean "and/or" unless explicitly indicated to refer to alternatives only or the alternatives are mutually exclusive, although the disclosure supports a definition that refers to only alternatives and "and/or."

As used herein "another" can mean at least a second or more.

The term "comprising", which is synonymous with "including," "containing," or "characterized by", is inclusive or open-ended and does not exclude additional, unrecited elements or method steps. "Comprising" is a term of art used in claim language which means that the named elements are essential, but other elements can be added and still form a construct or method within the scope of the claim.

As used herein, the phrase "consisting of" excludes any element, step, or ingredient not specified in the claim. When the phrase "consists of" appears in a clause of the body of a claim, rather than immediately following the preamble, it limits only the element set forth in that clause; other elements are not excluded from the claim as a whole.

As used herein, the phrase "consisting essentially of" limits the scope of a claim to the specified materials or steps, plus those that do not materially affect the basic and novel characteristic(s) of the claimed subject matter.

With respect to the terms "comprising", "consisting of", and "consisting essentially of", where one of these three terms is used herein, the presently disclosed subject matter can include the use of either of the other two terms.

As used herein, the term "about", when referring to a value is meant to encompass variations of, for example ±20% or ±10%, or for example ±5%, or for example ±1%, or for example ±0.1% from the specified amount, as such variations are appropriate to practice the disclosed inventions.

In addition, all ranges disclosed herein are to be understood to encompass any and all subranges subsumed therein. For example, a stated range of "1.0 to 10.0" should be considered to include any and all subranges beginning with a minimum value of 1.0 or more and ending with a maximum value of 10.0 or less, e.g., 1.0 to 5.3, or 4.7 to 10.0, or 3.6 to 7.9.

All ranges disclosed herein are also to be considered to include the end points of the range, unless expressly stated otherwise. For example, a range of "between 5 and 10", "from 5 to 10" or "5-10" should generally be considered to include the end points 5 and 10.

Further, when the phrase "up to" is used in connection with an amount or quantity, it is to be understood that the minimum amount is at least a detectable amount or quantity. For example, a material present in an amount "up to" a specified amount can be present from a detectable amount and up to and including the specified amount.

As used herein "straight" morphology generally refers to nanowires that do not curve and maintain vertical alignment relative to the substrate. Nanowires are generally "substantially straight" when they have some curvature in the top portion (farthest from the substrate). For example, the curvature (1/μm) can range from 0.1 to 0.2.

As used herein, "aspect ratio" refers to the ratio of length to diameter of the nanowire. Generally, an aspect ratio >5 is "high" for the nanowires of the present application.

As used herein, a nanowire array density is "high" density when 1-2 nanowires per square micrometer are found on the substrate.

As used herein, the phrase "substantially vertically aligned" refers to an orientation of a plurality of anisotropic objects (e.g., nanowires) in a population of the objects, wherein at least about 60 percent, at least about 70 percent, at least about 80 percent, or at least about 90 percent of the objects (e.g., nanowires) of the population have a vertical or substantially vertical orientation. A "vertical orientation" refers to an orientation wherein the long axis of an anisotropic object (e.g., a nanowire) forms an angle (θ) of less than about 30 degrees, less than about 15 degrees, or less than about 10 degrees with a vertical line or perpendicular to a substrate surface.

An "array" of objects (e.g., nanowires), as used herein, refers to a group of the objects on a surface. The "density" of an array refers to the percentage of the area of the surface that is occupied by the objects of the array (as opposed to being vacant or occupied by some other item). An "ordered" array refers to an array in which the arrangement of the objects within the array follows a pattern or substantially follows a pattern (i.e., within 20%, within 10%, or within 5% deviation from the pattern). For example, the objects of an "ordered" array can be arranged in regularly spaced rows and columns.

As used herein, "vapor phase growth" is growth based on the evaporation and condensation of a growth species from the bulk elemental source onto the substrate. For example, using a Ga source, an As source and an Sb source to grow a GaAsSb core.

II. Compositions Comprising Core-Shell Nanowires

In one aspect, compositions comprising one or more core-shell nanowires are described herein. The core-shell nanowires comprise a core and a first shell surrounding or substantially surrounding the core. The core is formed from $GaAs_{(1-y)}Sb_y$, where y=about 0.03-0.07, and the first shell is formed from $GaAs_{(1-x)}Sb_xN$ shell, where and x=0.27-0.34. Additionally, in some cases, the nanowires have an average emission maximum of between about 1.4 and about 1.7 μm, including measurements at room temperature. Moreover, in some instances, the nanowires further comprise a second shell surrounding or substantially surrounding the first shell. In some such embodiments, the second shell is formed from $Ga_{1-m}Al_mAs$, where m is 0-0.2, such as $Ga_{0.9}Al_{0.1}As$. Therefore, in some cases, the core-shell nanowires of a composition have the structure $GaAs_{(0.97-0.93)}Sb_{(0.03-0.07)}/GaAs_{(0.66-0.73)}Sb_{(0.27-0.34)}N/Ga_{(0.8-1)}Al_{(0-0.2)}As$.

Moreover, in some cases, a composition comprises an array of core-shell nanowires. For example, in some instances, a composition comprises an array of a plurality of core-shell nanowires as disclosed herein wherein the nanowires have an average emission maximum of between about 1.4 and about 1.7 μm at room temperature. In some cases, the array is an ordered array, such as an array in which the core-shell nanowires are arranged in regularly spaced rows and columns. In some embodiments, the core-shell nanowires of an array are aligned. For example, in some cases, the core-shell nanowires are vertically aligned or substantially vertically aligned, where the "vertical" direction corresponds to a direction perpendicular to the surface of the substrate on which the nanowires are disposed. Additionally, in some embodiments, the array of core-shell nanowires has a high nanowire density. For instance, in some high density embodiments, the core-shell nanowires occupy at least about 40%, at least about 50%, at least about 60%, at least about 70%, at least about 80%, or at least about 90% of the surface of the substrate on which the nanowires are disposed. In some cases, the core-shell nanowires occupy 40-100%, 40-90%, 40-80%, 40-70%, 50-100%, 50-90%, 50-80%, 50-70%, 60-100%, 60-90%, 60-80%, 70-100%, or 70-90% of the surface of the substrate on which the nanowires are disposed.

Specific components of core-shell nanowires will now be more particularly described. Core-shell nanowires described herein comprise a core, the core being formed from $GaAs_{(1-y)}Sb_y$, where y=about 0.03-0.07. As understood by one of ordinary skill in the art, a "core" of a core-shell nanowire can itself be a nanowire, where a "nanowire" is understood to refer to an anisotropic material or particle having a diameter (d) or size in two dimensions (e.g., height and width) of 1-1000 nm, 1-500 nm, or 1-100 nm, and an aspect ratio of at least 10, at least 20, or at least 30, or an aspect ratio of no more than 30, or not more than 30 or not more than 10, or the aspect ratio is between 5 and 30, or between 10 and 20. In one embodiment of the core-shell nanowire, the diameter of the nanowire is no more than about 100 nm, no more than about 200 nm, no more than about 300 nm, no more than about 400 nm or no more than about 500 nm in diameter. It is further to be understood that a nanowire can be cylindrical or substantially cylindrical. A nanowire can be faceted, or have a curved circumference such that the nanowire progressively bends in one direction.

The core of a nanowire can have any size and shape not inconsistent with the objectives of the present disclosure. In some embodiments, the core has an average diameter (or height or width) greater than the Bohr diameter of $GaAs_{(1-y)}Sb_y$, where y is about 0.03-0.07. In some cases, the core has an average diameter of no more than about 90 nm, no more than about 100 nm, or no more than about 110 nm or no more than about 120 nm, or between about 50-120 nm, or between about 60-110 nm or between about 70-90 nm.

Core-shell nanowires also comprise a first shell surrounding (or covering or "overcoating") or substantially surrounding (or covering or "overcoating") the core of the nanowires. As understood by one of ordinary skill in the art, a first shell that "surrounds" or "substantially surrounds" (or "covers" or "substantially covers" or "overcoats" or "substantially over- coats") the core can surround or substantially surround (or cover or substantially cover or overcoat or substantially overcoat) the circumference of the core, such that the first shell surrounds or substantially surrounds (or covers or overcoats) the core radially. The first shell may also surround or substantially surround (or cover or substantially cover or overcoat or substantially overcoat) the core on the ends or faces of the core longitudinally (i.e., at the ends of the "length" or "long dimension" of the core). Additionally, the first shell can surround (or cover or overcoat) at least about 75%, at least about 80%, at least about 85%, at least about 90%, at least about 95%, at least about 98%, or at least about 99%, or 100% of the relevant surface or surfaces of the core, based on area. Thus, in some cases, the first shell completely or substantially completely surrounds, covers, or overcoats the core.

As described above, the first shell is formed from $GaAs_{(1-x)}Sb_xN$. It is to be understood that the value of x (i.e., the antimony content) is determined, for example, according to scanning transmission electron microscope (STEM) energy-dispersive x-ray spectroscopy (EDS) analysis. Alternately, the antimony content can be determined by secondary ion mass spectroscopy in combination with standards of known antimony content.

The first shell of a core-shell nanowire can have any thickness that is not inconsistent with the objectives of the present disclosure. In some cases, the first shell has an average thickness greater than the Bohr diameter of $GaAs_{(1-x)}Sb_xN$ (which may be about 10 nm, in some cases). For instance, in some embodiments, the first shell has an average thickness of 30-90 nm or 50-80 nm. In some embodiments, the first shell thickness is at least about 20 nm, at least about 30 nm, at least about 40 nm, at least about 50 nm, at least about 60 nm, at least about 70 nm, at least about 80 nm, at least about 90 nm, at least about 100 nm, at least about 110 nm, at least about 120 nm or at least about 130 nm.

Core-shell nanowires, in some cases, further comprise a second shell surrounding (or covering or overcoating) or substantially surrounding (or covering or overcoating) the first shell of the nanowires. As understood by one of ordinary skill in the art, a second shell that "surrounds" or "substantially surrounds" (or "covers" or "substantially covers" or "overcoats" or "substantially overcoats") the first shell can surround or substantially surround (or cover or substantially cover or overcoat or substantially overcoat) the circumference of the first shell, such that the second shell surrounds or substantially surrounds (or covers or overcoats) the first shell radially. The second shell may also surround or substantially surround (or cover or substantially cover or overcoat or substantially overcoat) the first shell on the ends or faces of the first shell longitudinally (i.e., at the ends of the "length" or "long dimension" of the first shell). Additionally, the second shell can surround (or cover or overcoat) at least about 75%, at least about 80%, at least about 85%, at least about 90%, at least about 95%, at least about 98%, or at least about 99% of the relevant surface or surfaces of the first shell, based on area. Thus, in some cases, the second shell completely or substantially completely surrounds, covers, or overcoats the first shell.

The second shell can be formed from any material not inconsistent with the objectives of the present disclosure. In some cases, the second shell is formed from a Group V/III material. For instance, in some embodiments, the second shell is formed from $Ga_{1-m}Al_mAs$, where m=0-0.2, such as $Ga_{0.9}Al_{0.1}As$. Moreover, the second shell can have any thickness not inconsistent with the objectives of the present disclosure. In some cases, the second shell has an average thickness greater than the Bohr diameter of the material used to form the second shell (e.g., $Ga_{1-m}Al_mAs$, where m=0-0.2, such as $Ga_{0.9}Al_{0.1}As$). In other instances, the second shell has an average thickness less than or equal to the Bohr diameter of the material used to form the second shell (e.g., $Ga_{1-m}Al_mAs$, where m=0-0.2, such as $Ga_{0.9}Al_{0.1}As$). In some embodiments, the second shell has an average thickness of at least 5 nm, at least 10 nm, at least 15 nm, at least 20 nm, at least 25 nm, at least 30 nm, at least 35 nm or at least 40 nm. In some cases, the second shell has an average thickness of 5 nm-40 nm or 10-30 nm. Other thicknesses are also possible.

In one embodiment of the core-shell nanowire, the diameter of the nanowire is no more than about 100 nm, no more than about 200 nm, no more than about 300 nm, no more than about 400 nm, or no more than about 500 nm in diameter.

Additionally, in some cases, the physical structures of the first shell and the second shell are selected to obtain a desired electronic band structure within the core-shell nanowire. For example, in some instances, the composition and/or physical dimensions of the first shell and the second shell of a core-shell nanowire are selected such that the first shell and the second shell have a Type I band offset structure. In such a structure, as understood by one of ordinary skill in the art, the second shell has a higher energy bandgap than the first shell, and the conduction band of the second shell is higher energy than the conduction band of the first shell, and the valence band of the second shell is lower energy than the valence band of the first shell. Other band structures are also possible.

It is further to be understood that core-shell nanowires can have any total dimensions not inconsistent with the objectives of the present disclosure. For example, in some cases, the core-shell nanowires have an average diameter of 100-300 nm, 100-200 nm, 150-300 nm, or 150-250 nm. Further, in some embodiments, the nanowires have an average length of at least 500 nm, at least 1 µm, at least 2 µm, at least 5 µm, at least 10 µm, at least 15 µm, at least 20 µm, at least 25 µm, at least 30 µm, at least 40 µm, or at least 50 µm. In some instances, the nanowires have an average length of 500 nm-1 µm, 500 nm-2 µm, 500 nm-5 µm, 500 nm-10 µm, 750 nm-1 µm, 750 nm-2 µm, 750 nm-5 µm, 750 nm-10 µm, 1-5 µm, 1-10 µm, 1-20 µm, 2-5 µm, 2-10 µm, 2-20 µm, 5-10 µm, or 5-20 µm. Additionally, such nanowires can also have an aspect ratio of at least 20, at least 50, or at least 100. In some cases, core-shell nanowires have an aspect ratio of 1-50, 1-30, 1-20, 5-50, 5-30, 5-20, 10-50, 10-30, or 10-20.

Moreover, in some embodiments, core-shell nanowires having a high aspect ratio also have a straight or substantially straight morphology, as opposed to a curved morphology.

Additionally, core-shell nanowires can have any combination of sizes and shapes described hereinabove and not inconsistent with the objectives of the present disclosure. For example, in some cases, the nanowires have an average diameter of 150-250 nm or an average diameter of 250-300 nm, an average length of at least 1 µm, an average aspect ratio of at least 10. Other combinations of sizes and shapes are also possible.

Moreover, in some embodiments, an array or other population of core-shell nanowires is homogeneous or substantially homogeneous in size, shape, and/or composition. For instance, in some cases, the nanowires of a population or array have a size distribution (in diameter, length, and/or aspect ratio) of 15% or less, 10% or less, or 5% or less, where the percentage is based on two standard deviations from a mean size.

Core-shell nanowires described herein can also exhibit a variety of optical and/or luminescent properties. For example, in some cases, the nanowires have a room temperature (23° C.) photoluminescence (PL) quantum yield (QY) of at least 10%, at least 15%, at least 20%, at least 30%, or at least 40%. In some instances, the nanowires have a room temperature PL QY of 10-60%, 10-50%, 10-40%, 10-30%, 10-20%, 15-60%, 15-50%, 15-40%, 15-30%, 20-60%, 20-50%, 20-30%, 30-60%, or 30-50%. Moreover, without intending to be bound by theory, it is believed that the PL of a core-shell nanowire described herein, in some cases, can be emitted from the first shell of the core-shell nanowire, as opposed to being emitted from the core or the second shell.

As described further hereinbelow, core-shell nanowires described herein can be made in any manner not inconsistent with the objectives of the present disclosure. The core-shell nanowires may especially advantageously be made by molecular beam epitaxy (MBE), including solid source plasma assisted MBE, and vapor phase growth, including but not limited to vapor liquid solid growth, vapor solid growth, vapor solid growth, oxide-assisted growth, chemical vapor deposition, and self-catalytic growth.

EXAMPLES

The following Examples have been included to provide guidance to one of ordinary skill in the art for practicing representative embodiments of the presently disclosed subject matter. In light of the present disclosure and the general level of skill in the art, those of skill can appreciate that the following Examples are intended to be exemplary only and that numerous changes, modifications, and alterations can be employed without departing from the scope of the presently disclosed subject matter.

As shown herein, the core shell configuration of the NW provided the opportunity to utilize high density NWs as cores to grow shells of desired properties more easily as compared to high density growth of nitride NWs directly on Si. The strategy adopted here reduced the mismatch between the core and shell using a low Sb content GaAsSb core in place of conventional GaAs core. This ternary core also facilitated incorporation of high amount of Sb with a lower amount of N in GaAsSbN, thus allowing larger shell thickness with minimum defects and extended photodetection beyond 1.5 µm. Inclusion of nitrogen in the GaAsSb shell reduces the lattice parameter of GaAsSb shell; in this way improving the shell's lattice matching to the GaAsSb core, which itself has a lower Sb content. In the core-shell configuration, dilute amounts of nitrogen in the GaAsSb shell gave additional flexibility in this quaternary alloy for bandgap reduction due to enhanced bandgap bowing, which meant inclusion of a higher amount of Sb in the nitride shell compared to a non-nitride GaAsSb, and hence a closely lattice-matched shell to achieve similar bandgap reduction. The N incorporation is limited for the GaAsSb system; thus, the amount of Sb in the shell can be increased, and the bandgap is further reduced upon incorporation of small amounts of N.

Previous core-shell NWs based on a quaternary GaAsSbN first shell have not yielded photoluminescence beyond 1.4 µm. Attempts to incorporate high levels of both nitrogen and antimony have generally resulted in poor morphology (e.g.

curving, surface roughening, etc.) and deteriorating optical properties of GaAs/GaAsSbN core-shell NWs.

As shown herein, self-catalyzed molecular beam epitaxial (MBE) growth of NW configuration where the lattice mismatch at the core-shell interface is minimized by using a GaAsSb core of low Sb content, enabled incorporation of high Sb content in the GaAsSbN shell. The effects of N-plasma pressure on the NW morphology and bandgap bowing in a quaternary material system was studied. Further, variation of the NW thickness was carried out for N pressure optimized for vertical NWs with maximum redshift in PL. As shown herein, for a particular lattice-mismatched core-shell configuration, the thickness of the shell was kept within a limited thickness to enable efficient strain relaxation at the core-shell interface, thereby avoiding NW curving or islanding on a Sb-rich shell. The appropriate shell thickness was higher for a core with small amount of Sb due to lower lattice mismatch with a dilute nitride shell, thus allowing growth of thicker NWs having a smoother surface morphology. NWs having a reduced V/III ratio, while keeping the same N pressure and shell thickness, lead to simultaneous incorporation of more Sb as well as N with improved structural and optical quality in the absence of planar defects. A comparison of the optimized shell with the non-nitride shell was studied with respect to surface morphology, planar defects and PL emission. The optimized dilute nitride core-shell NWs show significant reduction in bandgap energy.

Experimental Details

The growth of $GaAs_{0.97}Sb_{0.03}/GaAs_{0.73}Sb_{0.27}N$ was carried out on chemically etched (piranha/HF) p-type Si (111) substrate in a solid-source plasma-assisted EPI 930 MBE system. The details of the Si substrate preparation are provided in Kasanaboina P K, Ojha S K, Sami S U, Lewis Reynolds C, Liu Y, Iyer S, Effect of Growth Parameters and Substrate Surface Preparation for High-Density Vertical GaAs/GaAsSb Core-Shell Nanowires on Silicon with Photoluminescence Emission at 1.3 µm, Journal of Electronic Materials, 2016, 45(4):2108-2114. The core was grown at a substrate temperature of 620° C., while the shell was grown at a temperature of 540° C.

A constant Ga BEP of $2.4 \times 10^{-7}$ Torr was used for all the experiments described herein. The core growth was carried out by opening the Ga source for 15 s and then opening the As source ($4.68 \times 10^{-6}$ Torr) and Sb source ($1.2 \times 10^{-7}$ Torr). The proportion of beam equivalent pressures (BEPs) of As, Sb to Ga, and N-plasma pressure used for shell growths are identified herein. For shell growth, N-plasma pressure was varied for the first set of experiment. In all experiments thereafter, a constant N-plasma pressure of $1.2 \times 10^{-7}$ Torr was used for dilute nitride shell. As used herein, the term "V/III BEP ratio" refers to Group V BEP (As BEP 70% and Sb BEP 30%) to Ga BEP, measured using a beam flux monitor.

Scanning electron microscope (SEM) images were acquired using a high-resolution Carl Zeiss Auriga-BU FIB field emission scanning electron microscope (FESEM). Scanning transmission electron microscopy (STEM)—energy-dispersive X-ray spectroscopy (EDS) was used to extract a detailed compositional profile of the NW samples, which was performed on a JEOL 1060 F system operated at 200 kV. The atomic size and composition of N is too low compared to that of Sb to be accurately detected in these NWs due to close proximity of the N-K line and the Sb-M line energies. Micro-photoluminescence (µ-PL) measurements were conducted in a low-vibration closed-cycle optical cryostat from Montana Cryostation with a He—Ne ($\lambda=633$ nm) laser for excitation.

The laser power was varied for excitation power dependent measurements using a neutral density filter (NDF). The PL signal from the sample was then dispersed through a 0.32 m double grating monochromator with a liquid nitrogen-cooled InGaAs detector for detection using conventional lock-in techniques. Raman spectroscopy was carried out at ambient temperature using a Horiba Jobin Vyon confocal Raman microscope with a He—Ne ($\lambda=633$ nm) laser.

Results and Discussion

Variation of N-Plasma

Figure 1A:
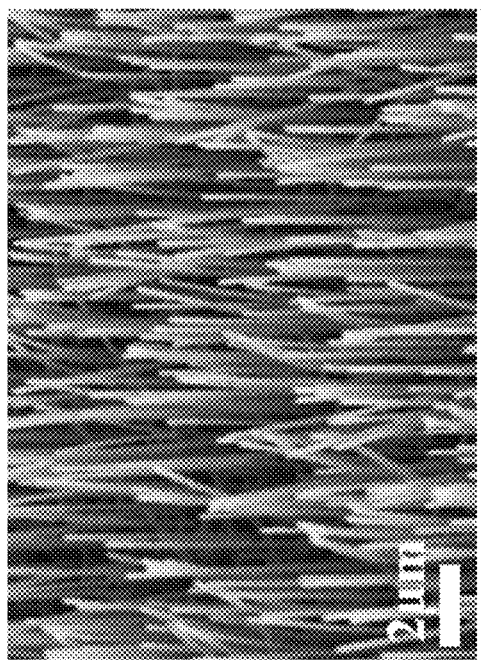
FIG. 1A illustrates a scanning electron microscope (SEM) image of $GaAs_{0.95}Sb_{0.05}/GaAs_{0.7}Sb_{0.3}N$ core-shell nanowires under no nitrogen plasma pressure.
Figure 1D:
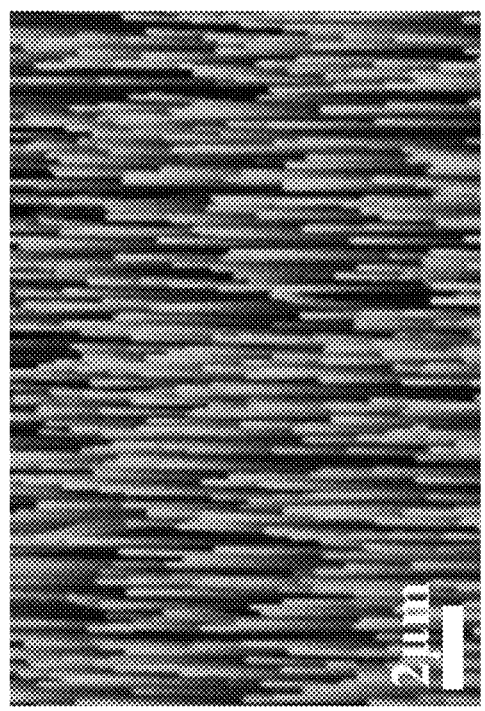
FIG. 1D illustrates an SEM image of $GaAs_{0.95}Sb_{0.05}/GaAs_{0.7}Sb_{0.3}N$ core-shell nanowires under high nitrogen plasma pressure.
Figure 1C:
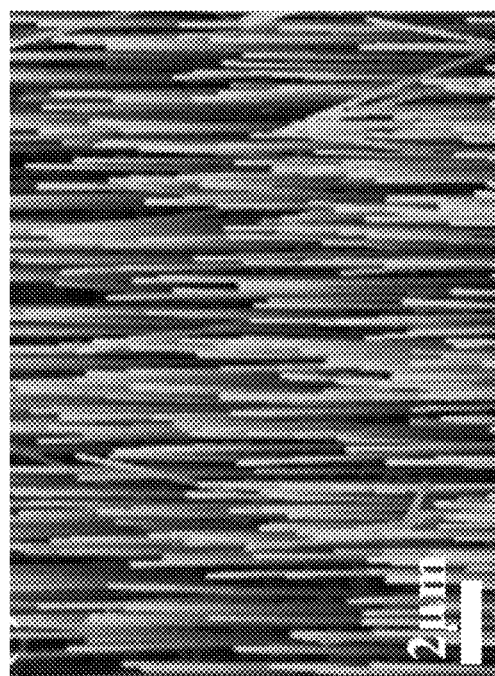
FIG. 1C illustrates an SEM image of $GaAs_{0.95}Sb_{0.05}/GaAs_{0.7}Sb_{0.3}N$ core-shell nanowires under medium nitrogen pressure

Variation of nitrogen plasma (N-plasma) pressure was carried out in the growth of the dilute nitride shell in the GaAsSb/GaAsSbN core-shell nanowire configurations for three different N-plasma BEP pressures of $6 \times 10^{-8}$ Torr, $1.2 \times 10^{-7}$ Torr and $1.7 \times 10^{-7}$ Torr, herein referred as low, medium and high N-plasma pressures, respectively. Growth duration of the shell was kept invariant at 8 minutes, leading to a NW thickness of 150 nm. Nanowires with a non-nitride shell were used as a reference. The growth rate of the shell was found to increase from 6.3 nm/s for non-nitride shell to 8.4 nm/s for high nitrogen shell. SEM images of these NWs revealed that the pronounced curvature of the NWs observed for reference non-nitride NWs and low N-plasma pressure (FIGS. 1A and 1B) became progressively more straight and vertical with increasing N-plasma pressure (FIGS. 1C and 1D).

The observed straightening and verticality is evidence of N incorporation. Without being bound by any theory, inclusion of N in the GaAsSb lattice leads to reduction in the lattice parameter thus reducing the lattice mismatch at the core-shell interface thereby reducing the compressive strain. Asymmetry of shell thickness is not likely to occur in the reference non-nitride and low-N NWs due to presence of only one Group-III atom (Ga) limiting the shell growth. Thickness/composition-induced asymmetry is more likely to exhibit bending in thinner NWs, since the asymmetry was significantly reduced with higher thickness.

Figure 2B:
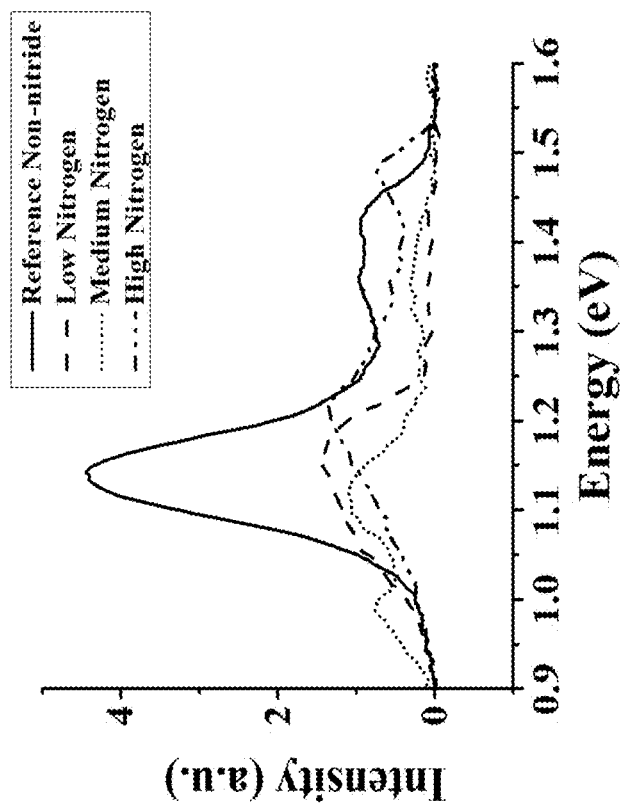
FIG. 2B is a photoluminescence (PL) spectra of intensity (a.u.) as a function of energy (eV) for $GaAs_{0.95}Sb_{0.05}/GaAs_{0.7}Sb_{0.3}N$ core-shell nanowires prepared under varying N-plasma pressures.
Figure 2A:
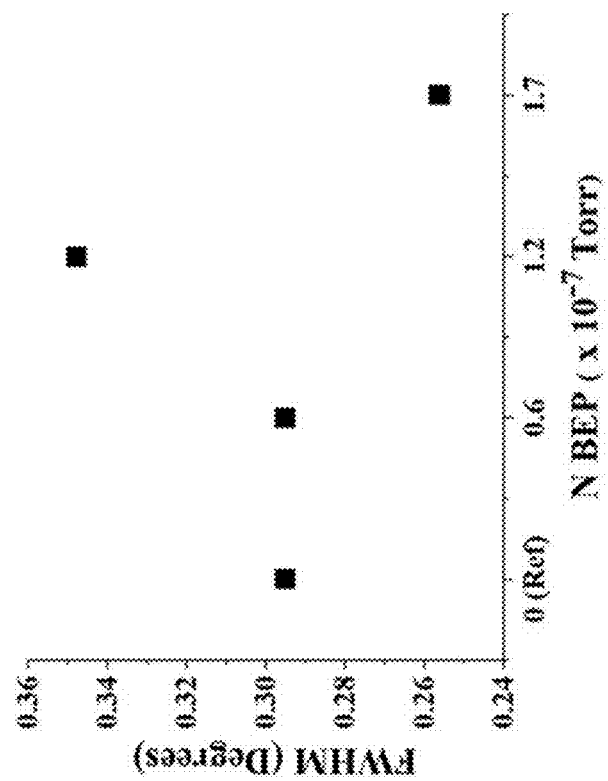
FIG. 2A is a plot of XRD FWHM (full width at half-maximum) vs. N-plasma pressure ($\times 10^{-7}$ Torr).

The superimposed 4K PL in FIG. 2B reveal significant suppression of intensity for nitride NWs. Emergence and redshift of N-related peak was also observed with increasing N-plasma pressure up to medium nitrogen pressure, which can be attributed to N-induced formation of band tail states. However, for the high nitrogen (HN) sample the entire spectra exhibited blueshift, which may be due to a Sb-kick out mechanism by N under high N-plasma pressure thereby suppressing Sb incorporation. The long tail on the lower energy segment of the PL spectra is consistent with N incorporation. The Raman spectra showed a systematic blueshift with increasing N-plasma pressure in the NWs. Without being bound by theory, the Raman spectra blueshift could be due to an increase in N or a decrease in Sb content, or both. The initial blue shift up can be attributed to medium nitrogen (MN) plasma pressure to N incorporation and for the high nitrogen sample to the Sb reduction based on all the combined results from XRD, and PL discussed as follows. Up to MN, both the XRD and PL data follow the trend on the FWHM (full width at half-maximum) and PL spectral shift and N-related peaks. For HN, narrowing of the XRD spectra with concomitant PL spectral blue shift clearly suggest lower disorder with reduced Sb. The medium N-plasma pressure of $1.2 \times 10^{-7}$ Torr was effective for simultaneous N and Sb incorporation in the shell. Using this N pressure, other growth parameters, namely shell thickness variation and V/III ratio reduction were examined, to reduce the band gap with no further degradation in the NW optical and structural properties.

Variation of Thickness

Figure 3B:
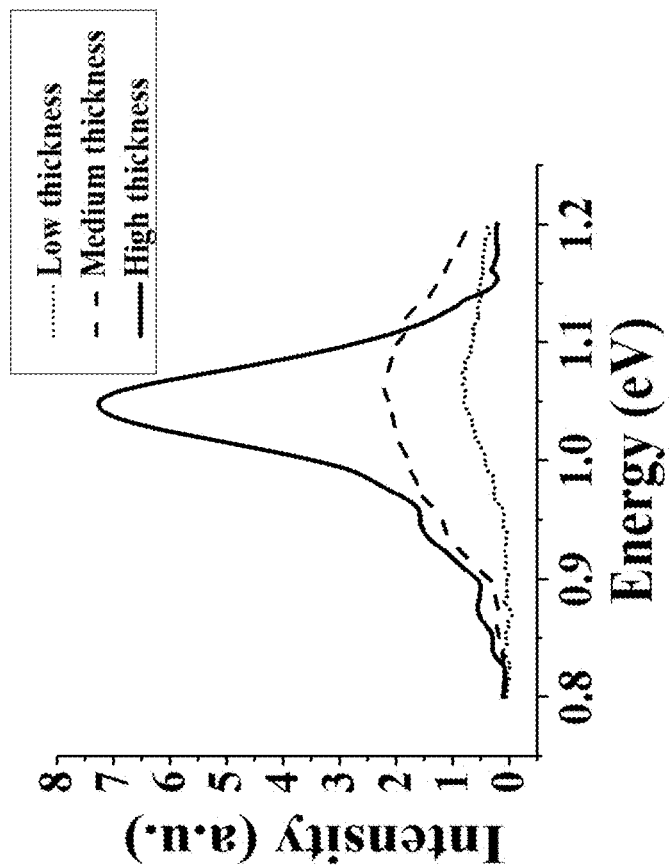
FIG. 3B is a Photoluminescence (PL) spectrum of intensity (a.u.) as a function of energy, with three different core-shell nanowire thicknesses.
Figure 3A:
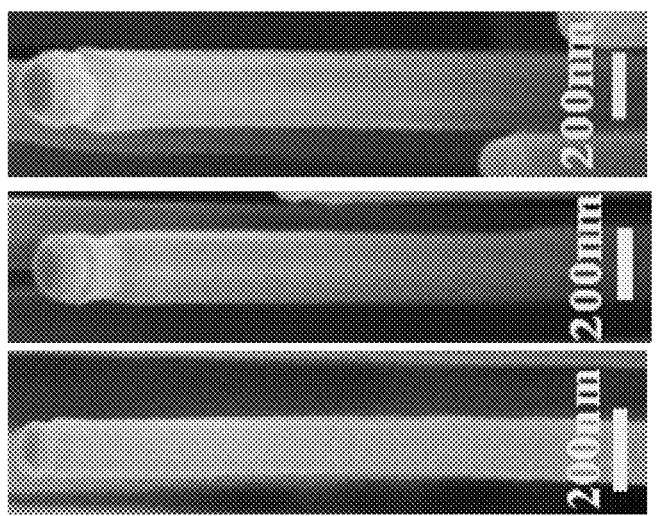
FIG. 3A illustrates SEM images of $GaAs_{0.95}Sb_{0.05}/GaAs_{0.7}Sb_{0.3}N$ core-shell nanowires with variation in shell thickness (increasing from left to right) for NWs grown with Group V/III Beam Equivalent Pressure (BEP) ratio of 20 and optimized N BEP of $1.2\times10^{-7}$ Torr.

Using the optimized N-plasma pressure of MN, growth of core shell NWs of different shell thickness were examined, by varying growth durations for three different shell thickness leading to NW diameters of 150 nm, 200 nm and 250 nm. All the NWs exhibited hexagonal facets, with smooth morphology as shown in SEM images (FIG. 3A). The smooth morphology indicated a lack of any thickness-induced strain between low Sb content core and nitride shells for all these NWs. The photoluminescence spectra exhibited slightly redshifted peaks with an increase in thickness, with significant improvement in the FWHM and intensity (FIG. 3B). The N-induced shoulder peaks were more pronounced in the thicker nanowires due to the larger volume of the nitride shell when probed optically. The surface exhibited well-faceted, smooth surface morphology, indicating less strain at the interface, which helps to sustain coherently strained thicker shell. The study of thickness variation also ruled out contribution of thicker shells in inducing strain at the core-shell interface for this core. NW of thickness of 250 nm with medium nitrogen (MN) plasma, was used for shell growths to fine-tune the shell composition in order to achieve further bandgap reduction.

Variation of Ratio

Figure 4B:
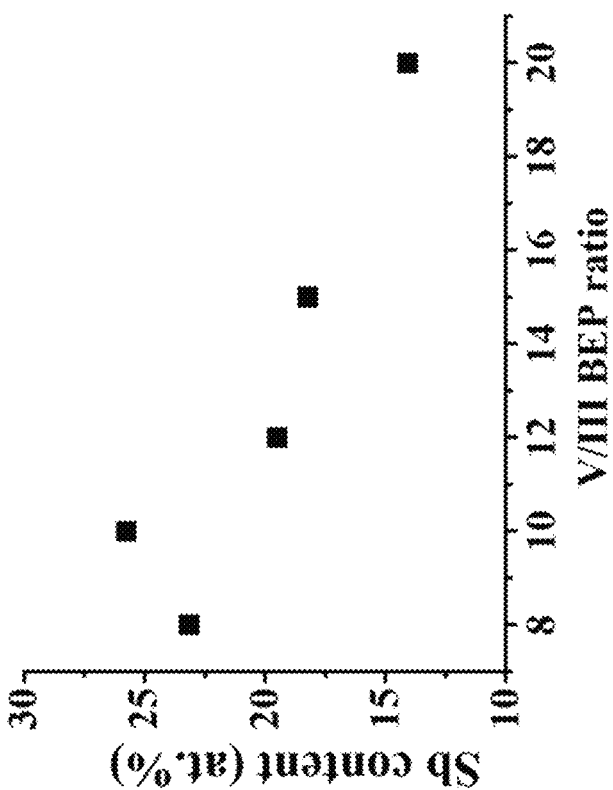
FIG. 4B is a graph of Sb content (at. %) vs. V/III BEP ratio.
Figure 4A:
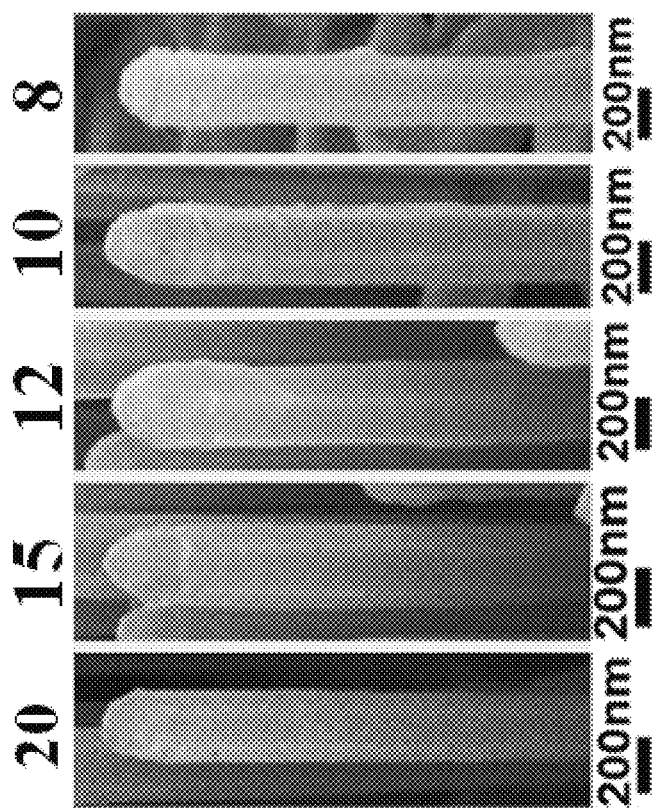
FIG. 4A illustrates SEM images of core-shell nanowires prepared with different V/III BEP ratio (from left to right: 20, 15, 12, 10 & 8).

The V/III BEP ratio was varied during the nitride shell growth to study the effects of As—Sb and N exchange on the bandgap of the core-shell NWs. The second shell of $Ga_{0.9}Al_{0.1}As$ was grown on GaAsSb/GaAsSbN as the passivating layer, to suppress non-radiative surface recombination and to improve the PL emission in these NWs. The $Ga_{0.9}Al_{0.1}As$ outer shell was not grown in earlier NWs in order to succinctly delineate the effects of N incorporation and thickness of the shell. The V/III BEP ratio was varied from 20 to 15, 12, 10, and further reduced to 8 by changing the As and Sb BEPs with Sb/As BEP ratio, Ga and N BEPs remaining invariant. The nanowires exhibited well defined hexagonal facets with surface roughness visibly increasing with a reduction in the V/III BEP ratio (FIG. 4A).

The shell thickness was found to be invariant with varying V/III BEP ratios, suggesting Ga-limited growth rate of the shell and sufficient availability of Group V atoms for sustaining the radial growth in all the cases. The SEM-EDS compositional analysis revealed an increase in Sb composition with a reduction in the V/III BEP ratio (FIG. 4B). Without being bound by theory, this could be based on the As and Sb interaction with Ga since Ga is the only Group-III element that the Group-V atoms can bond. It is likely that at lower V/III BEP ratios, the higher surface diffusion of Sb (compared to that of As) leads to enhanced Sb interaction with Ga influencing its incorporation. For V/III BEP ratio of 15 or higher, increased As with respect to Ga prevents Sb incorporation due to the increased Sb to As exchange as Sb tends to move towards the surface due to its surfactant property. Although the N-plasma pressure is maintained constant, the amount of N relative to other Group-V atoms is greater and its incorporation is therefore expected to rise with decreasing V/III BEP ratio. Relatively rougher surface morphology with decreasing V/III BEP ratio could be due to increased Sb incorporation, or to increased Sb and N incorporation.

X-ray diffraction was performed on the NWs to confirm the effects of Sb and N incorporation in the GaAs lattice. The non-nitride sample showed a twin Bragg peak corresponding to the two different compositions of the GaAsSb (111) in the core and the shell, where the lower angle peak represents a higher Sb composition. For the nitride samples, up to V/III BEP ratio reduction to 12, only the higher Bragg angle peak was observed, indicative of coherently strained core-shell structure. For V/III BEP ratio of 10 and 8, there was a significant shift to lower Bragg angle peak with a satellite peak emerging close to that of the non-nitride sample, suggesting higher N incorporation in both these NWs.

Figure 5:
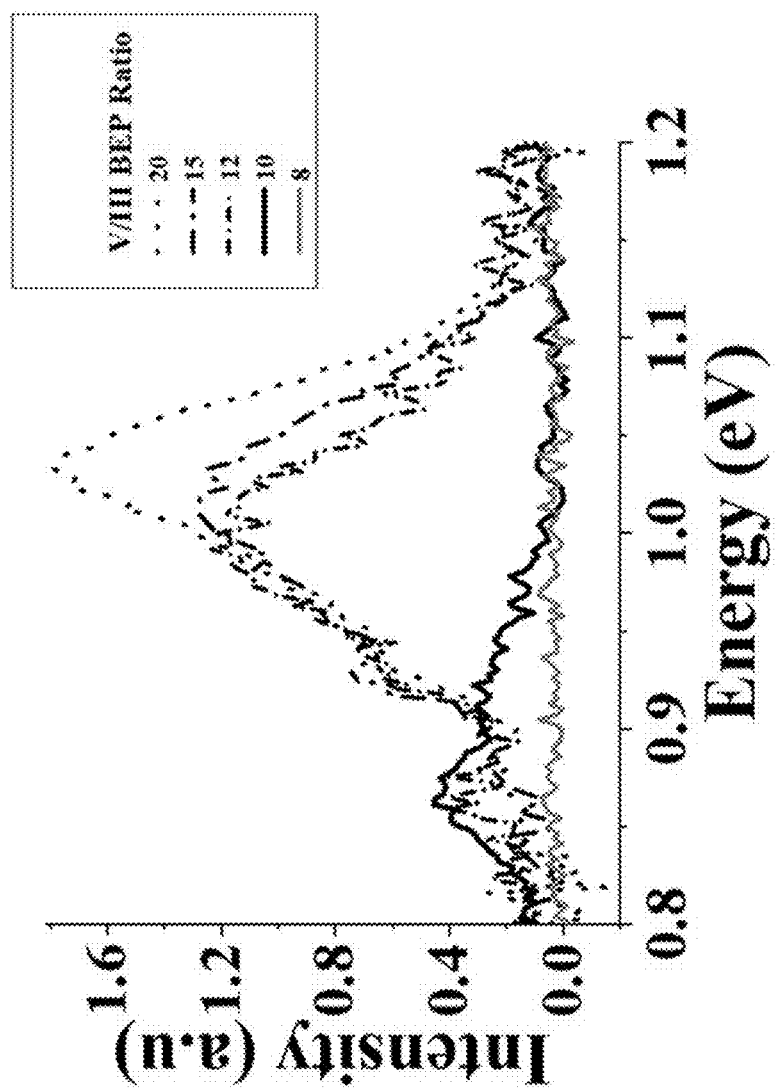
FIG. 5 is a 4K μ-PL spectrum variation for the nitride-containing NWs prepared at different V/III BEP ratios.

The photoluminescence (PL) emission at 4K showed a small redshift to lower bandgap energy with a marginal decrease in PL peak intensity with V/III BEP reduction ratio up to 12 (FIG. 5). Thereafter, a further reduction in V/III BEP ratio to 10 results in a much larger redshift of the PL peak energy to 0.87 eV accompanied by a significant drop in the intensity, which vanishes for BEP ratio of 8. These observations in the NW samples with a BEP ratio of 10 and 8 correspond to enhanced N incorporation and associated N-related non-radiative recombination centers. This is also borne out by a shift in the XRD Bragg peak for these two samples. The enhanced Sb incorporation in these two samples as suggested by EDS data reveals that a higher amount of Sb facilitates N incorporation into the shell, that is, lowering the V/III BEP ratio effectively increases both the Sb and N incorporations. As Sb and N affect band offsets of valence and conduction band, respectively, simultaneous enhancement of both these elements has a cumulative effect on the band gap reduction and explains the large redshift in the PL peak energy.

The variation in Raman spectra with V/III BEP ratio is shown in FIG. 6. The GaAs LO and TO modes for NWs with V/III BEP ratio of 20 are observed at 282 $cm^{-1}$ and 262 $cm^{-1}$, respectively. For V/III BEP ratio of 15, 12, 10, the Raman LO and TO modes exhibit redshift relative to BEP ratio of 20, and the lineshape becomes more symmetric. Interpretation of the Raman shift in dilute nitride nanowires is complicated due to the effects of N-related point defects leading to large redshift, and consequently masks the shift arising from the compositional alloying. A large redshift accompanied with broadening and a more symmetric lineshape of the TO mode in nitride NWs may be evidence of enhanced N incorporation and N-related point defects. The V/III BEP ratio of 8 exhibited the largest redshift of the samples studied, consistent with high N incorporation and N related defects. Surface morphology is also the roughest for this sample, as evident from the SEM image.

The V/III BEP ratio of 10 was thus compared with the non-nitride shell grown under identical conditions to discern the effect of N. The growth rate of the shell in the nitride and non-nitride NWs remained comparable due to use of the same Ga BEP.

Figure 6C:
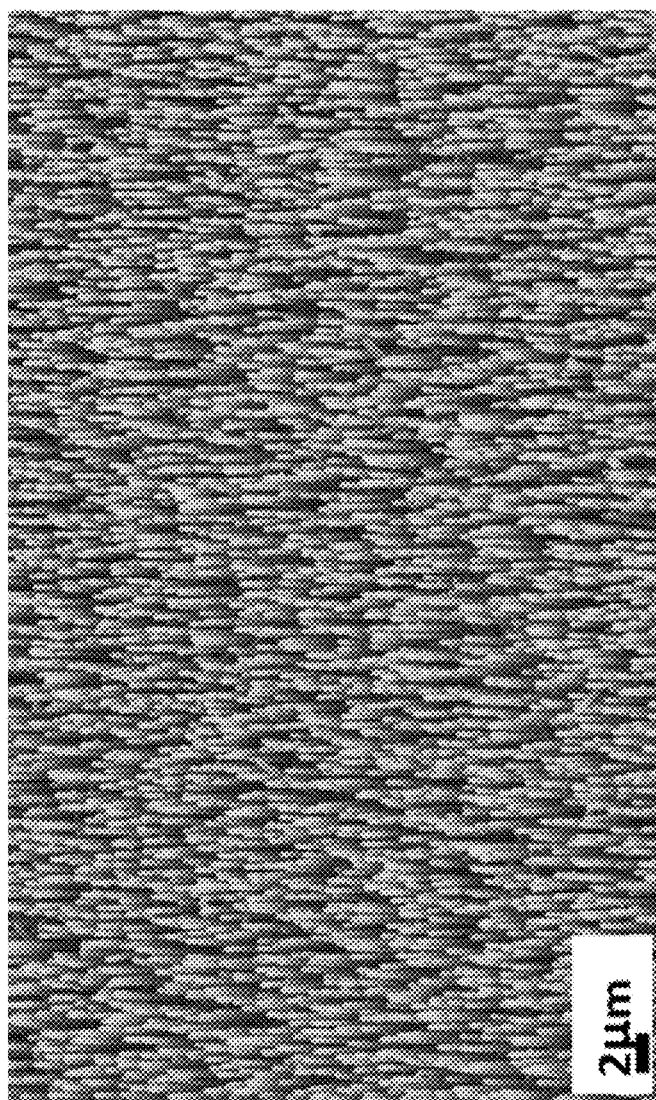
FIG. 6C illustrates an SEM image of an array of $GaAs_{0.97}Sb_{0.03}/GaAs_{0.73}Sb_{0.27}N/Ga_{0.9}Al_{0.1}As$ nanowires.
Figure 6B:
FIG. 6B illustrates an SEM image of a nitride $GaAs_{0.97}Sb_{0.03}/GaAs_{0.73}Sb_{0.27}N/Ga_{0.9}Al_{0.1}As$ single NW grown with V/III BEP ratio of 10.

High-density core-shell NWs were achieved in both nitride and non-nitride configurations. The density for dilute nitride NWs (FIG. 6C) was about 2 $\mu m^2$. The nitride NWs grown with V/III BEP ratio of 10 show smoother morphology (FIG. 6B) and reduced islanding as compared to its non-nitride counterpart (FIG. 6A), as illustrated in the SEM images (FIG. 6A-6B).

The comparison of non-nitride and nitride NWs indicate that incorporation of N smooths the surface morphology due to less compressive strain at the core-shell interface. Depending on relative As—Sb and N BEPs, the composition of the shell varies, which determines the extent of a mismatch with the GaAsSb core. The mismatch induced strain at the core-shell interface is a key factor for the surface morphology, irrespective of presence or absence of nitrogen in the shell.

Figure 6A:
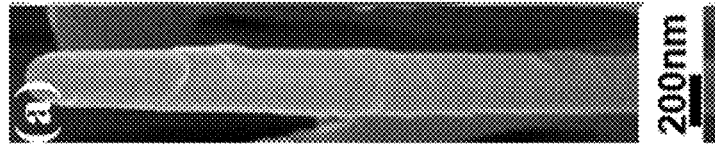
FIG. 6A illustrates an SEM image a non-nitride $GaAs_{0.97}Sb_{0.03}/GaAs_{0.73}Sb_{0.27}/Ga_{0.9}Al_{0.1}As$ core-shell single NW grown with V/III BEP ratio of 10.
Figure 6D:
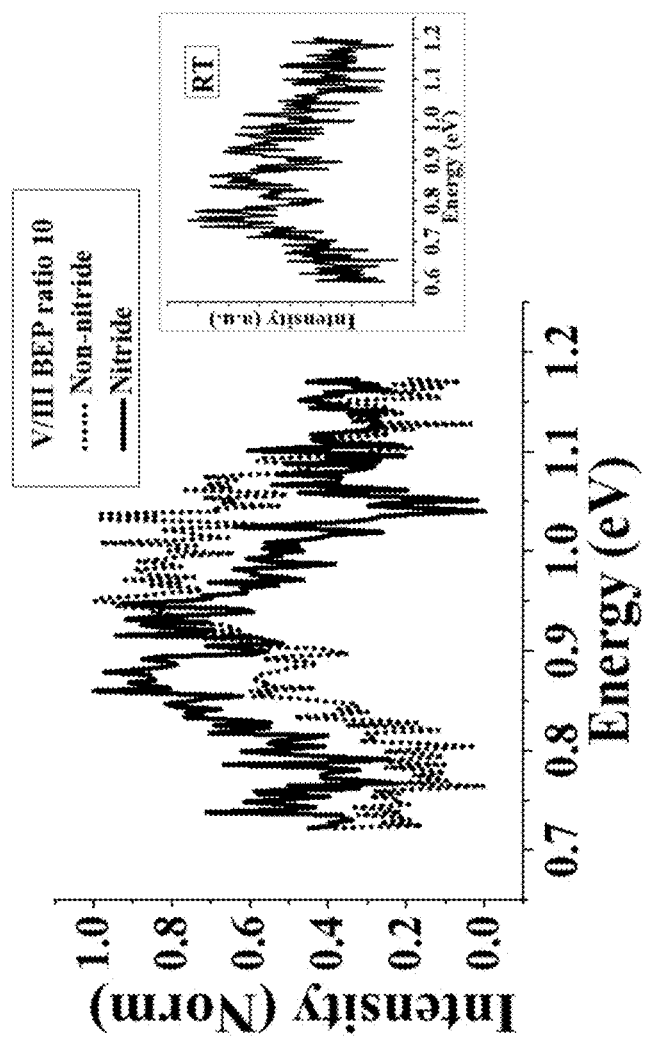
FIG. 6D is a 4K PL spectra for non-nitride and nitride NWs grown with V/III ratio of 10; the insert is a room temperature PL spectrum for the nitride nanowire.

The non-nitride NWs grown with V/III BEP ratio of 10 show increased surface roughening as well as islanding on the shell in some cases FIG. 6A. The islanding effects can be attributed to three cumulative factors: (i) the presence of a relatively higher amount of Ga for a lower V/III ratio, allowing more nucleating sites; (ii) the surfactant effect of Sb limits the diffusion of Ga, thus compounding the effect of Ga on enhancing the nucleation sites; and (iii) the higher lattice mismatch with increasing Sb in the shell leads to larger strain in the shell. Inclusion of N relieved the strain and improved the surface morphology of core-shell dilute nitride NWs.

A 4K PL redshift in nitride NWs (FIG. 6D) in comparison to non-nitride NWs indicates a nitrogen-induced bandgap reduction. For nitride samples, the room temperature PL peak was observed at 0.74 eV, corresponding to 1.7 μm.

The combined analysis of morphology from SEM, optical properties from PL as well as Raman, and composition from EDS and XRD data suggests a strong correlation of structural and optical properties with core-shell composition-dependent mismatch-induced strain.

TEM Analysis of Optimized Nanowires

Figure 7C:
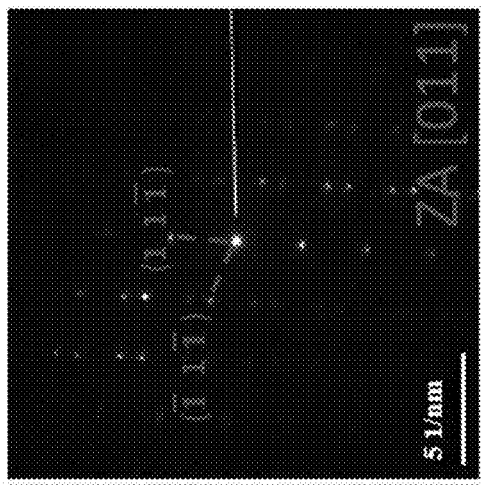
FIG. 7C illustrates selected area electron diffraction (SAED) pattern for a region of the non-nitride NW shown in FIG. 7B.
Figure 7E:
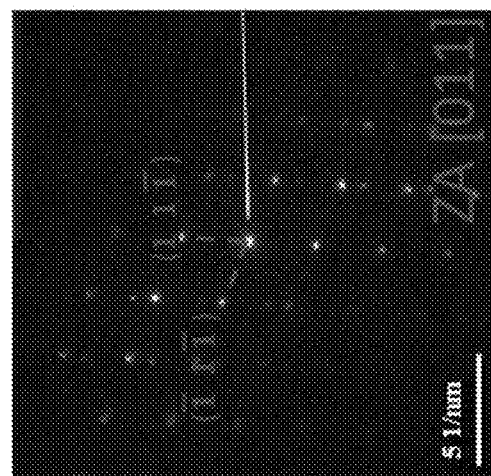
FIG. 7E illustrates selected area electron diffraction (SAED) pattern for a region of the non-nitride NW shown in FIG. 7D, confirming the presence of planar defects.
Figure 7B:
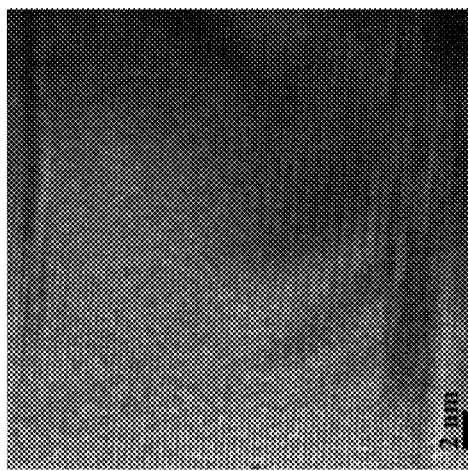
FIG. 7B illustrates an HRTEM image of the top region of the GaAsSb-containing shell ($GaAs_{0.73}Sb_{0.27}$) of the non-nitride nanowire.
Figure 7D:
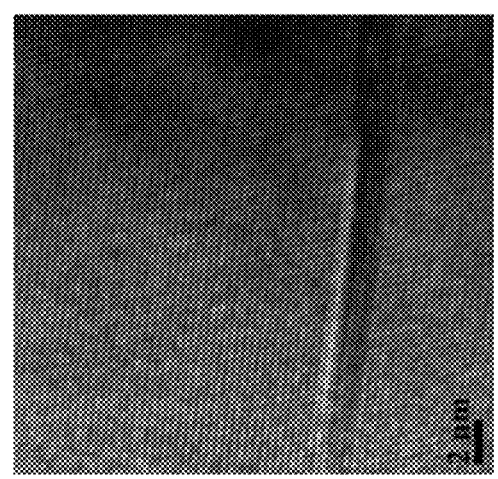
FIG. 7D illustrates an HRTEM image of the bottom region of the GaAsSb-containing shell ($GaAs_{0.73}Sb_{0.27}$) of the non-nitride nanowire

TEM characterization was carried out on non-nitride and nitride NWs grown using V/III BEP ratio of 10. The selected area electron diffraction (SAED) patterns of both the NWs reveal a zinc blende crystal structure as illustrated in FIG. 7 and FIGS. 8C and 8E. The EDS analysis for both the nitride and non-nitride NWs confirm x~0.27 for the shell and y~0.03 for core in the $GaAs_{1-y}Sb_y/GaAs_{1-x}Sb_x(N)/Ga_{1-m}Al_mAs$ NWs.

Figure 7A:
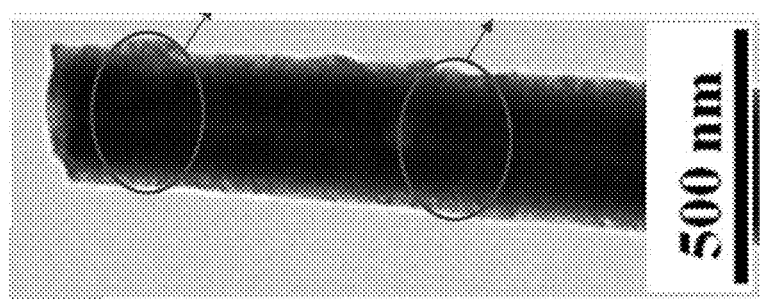
FIG. 7A illustrates a bright-field TEM image of non-nitride $GaAs_{0.97}Sb_{0.03}/GaAs_{0.73}Sb_{0.27}/Ga_{0.9}Al_{0.1}As$ NW.
Figure 8C:
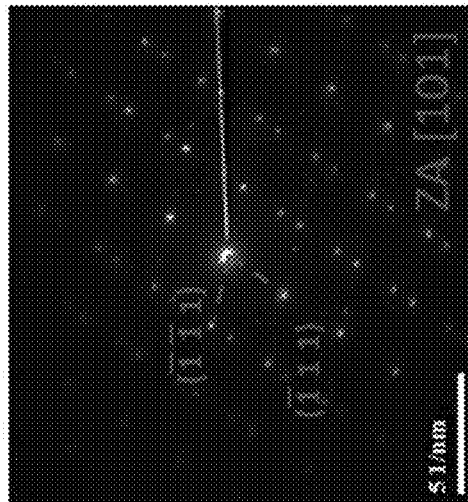
FIG. 8C illustrates selected area electron diffraction (SAED) pattern for a region of the nitride NW shown in FIG. 8B.
Figure 8E:
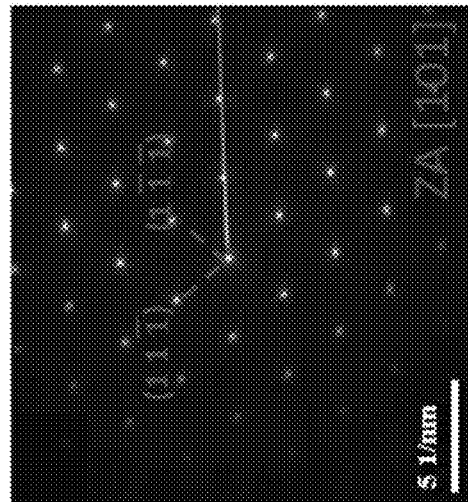
FIG. 8E illustrates selected area electron diffraction (SAED) pattern for a region of the nitride NW shown in FIG. 8D, showing a defect-free structure.
Figure 8B:
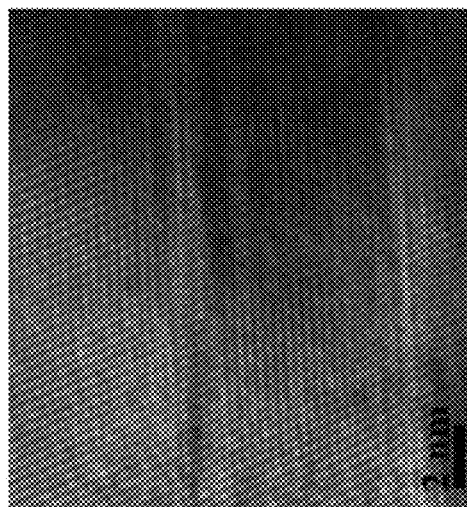
FIG. 8B illustrates an HRTEM image of the top region of the GaAsSbN-containing shell ($GaAs_{0.73}Sb_{0.27}N$) of the nitride nanowire.
Figure 8D:
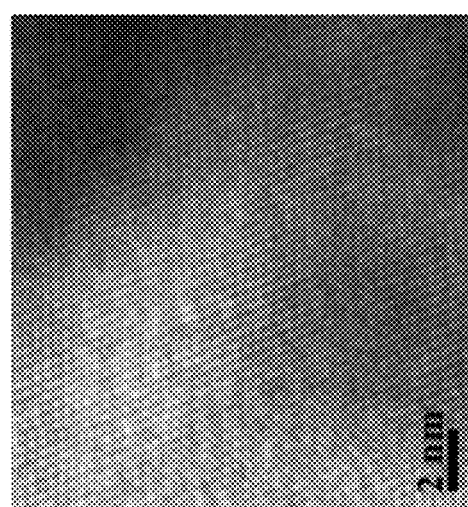
FIG. 8D illustrates an HRTEM image of the bottom region of the GaAsSbN-containing shell ($GaAs_{0.73}Sb_{0.27}N$) of the nitride nanowire.
Figure 8A:
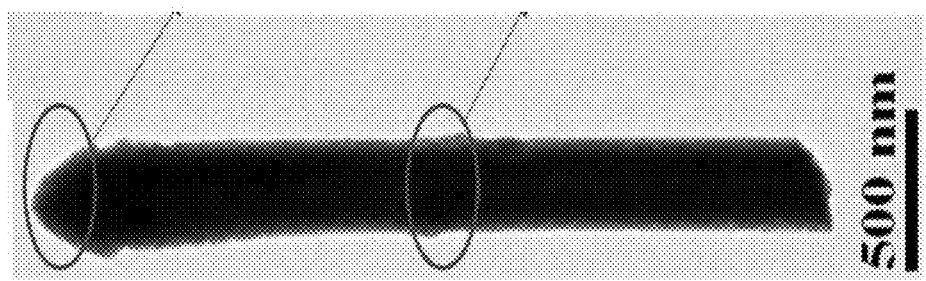
FIG. 8A illustrates a bright-field TEM image of nitride NW $GaAs_{0.97}Sb_{0.03}/GaAs_{0.73}Sb_{0.27}N/Ga_{0.9}Al_{0.1}As$

FIG. 7A shows bright field TEM (BF-TEM) image of the non-nitride NW with rough morphology. The SAED pattern confirms the presence of stacking faults over the entire length of the NW (FIGS. 7C and 7E). The TEM image (FIG. 8A) shows smoother morphology for the nitride NW except for the top region of consumed Ga droplet prior to the onset of the shell growth. The microstructural evolution of planar defects at the tip during the process of the Ga droplet consumption is consistent with literature. The SAED patterns (FIG. 8C) confirm the presence of twins and stacking faults in the top region of NW, while the rest of the NWs exhibited defect-free zinc blende structure (FIG. 8E), corroborating with SEM observations. Thus, N induced lattice relaxation at the interface leads to planar defect-free NW heterostructure.

The core-shell architecture of the NWs enables bandgap engineering in dilute nitride alloys to extend the wavelength region of interest and facilitates the growth of planar defect-free high quality and high-density NWs.

In summary, high density vertical Ga-catalysed GaAsSb/GaAsSbN/GaAlAs core-multishell nanowires with 4K PL up to 1.43 μm have been prepared using the methods disclosed herein. Advantages of N incorporation, such as reduction in curving, reduced surface roughness and a lower bandgap energy in GaAsSb-based NWs, have been demonstrated. A ternary $GaAs_{0.97}Sb_{0.03}$ core has been shown to enable the growth of a high Sb content dilute N shell to achieve a red shift in the 4K PL peak energy to 0.87 eV. Key experimental parameters, including N-plasma pressure, shell thickness, and V/III BEP ratio, are influenced by the interplay amongst As and Sb and N to realize thick coherently strained core-shell heterostructured NWs, which achieve a significant reduction in the bandgap. Bandgap engineering using N incorporation in the shell leads to high density, faceted surface morphology, straight and vertical nanowires.

It will be understood that various details of the presently disclosed subject matter may be changed without departing from the scope of the presently disclosed subject matter. Furthermore, the foregoing description is for the purpose of illustration only, and not for the purpose of limitation.

The invention claimed is:

1. A method of synthesizing a core-shell nanowire, the method comprising:
   forming a nanowire core by depositing first precursor sources on a growth substrate; and
   surrounding the nanowire core with a first shell by depositing the first precursor sources on the nanowire core in presence of nitrogen (N) plasma;
   wherein the core-shell nanowire is grown vertically relative to the growth substrate; and
   wherein the first precursor sources are gallium (Ga), arsenic (As), and antimony (Sb).

2. The method of claim 1, further comprising; surrounding the first shell with a second shell by depositing second precursor sources on the first shell, wherein the second precursor sources for the second shell are gallium (Ga), aluminum (Al), and arsenic (As).

3. The method of claim 1, wherein the forming the nanowire core comprises depositing Ga, then additionally depositing As and Sb while continuing to deposit Ga.

4. The method of claim 1, wherein the growth substrate is p-type silicon.

5. The method of claim 1, wherein the core-shell nanowire is grown vertically to a length ranging from about 500 nm to about 2000 nm.

6. The method of claim 1, wherein forming the nanowire core comprises using molecular beam epitaxy to deposit Ga, As, and Sb.

7. The method of claim 6, wherein forming the nanowire core to an average diameter ranging from about 50 nm to about 110 nm.

8. The method of claim 6, wherein the Ga is deposited at a beam equivalent pressure about $2.4 \times 10^{-7}$ Torr.

9. The method of claim 6, wherein the As is deposited at a beam equivalent pressure about $4.68 \times 10^{-6}$ Torr.

10. The method of claim 6, wherein the Sb is deposited at a beam equivalent pressure about $1.2 \times 10^{-7}$ Torr.

11. The method of claim 1, wherein surrounding the nanowire core with the first shell comprises using molecular beam epitaxy to deposit Ga, As, Sb in presence of nitrogen plasma.

12. The method of claim 11, wherein the nitrogen plasma is applied at a beam equivalent pressure ranging from about $6 \times 10^{-8}$ Torr to about $1.7 \times 10^{-7}$ Torr.

13. The method of claim 11, wherein the As, Sb, and Ga are deposited at an As and Sb to Ga beam equivalent pressure ratio ranging from about 8:1 to about 20:1.

14. The method of claim 1, wherein surrounding the nanowire core with the first shell comprises depositing the Ga, As, Sb, and N at a thickness ranging from about 20 nm to 130 nm.

15. The method claim 1, wherein forming the nanowire core is carried out at a temperature of 620° C.

16. The method claim 1, wherein surrounding the nanowire core with the first shell is carried out at a temperature of 540° C.

17. The method of claim 1, wherein the surrounding the nanowire core with the first shell comprises lattice-matching between the nanowire core and the first shell.

18. The method of claim 2, wherein surrounding the first shell with the second shell comprises using molecular beam epitaxy to deposit Ga, Al, and As.

19. The method of claim 18, wherein surrounding the first shell with the second shell comprises depositing the Ga, Al, and As at a thickness ranging from about 5 nm to 40 nm.

20. A core-shell nanowire synthesized by the method of claim 2.

21. The core-shell nanowire of claim 20 having a formula $GaAs_{(1-y)}Sb_{(y)}/GaAs_{(1-x)}Sb_{(x)}N/Ga_{(1-m)}Al_{(m)}As$, wherein
$GaAs_{(1-y)}Sb_{(y)}$ is the nanowire core;
$GaAs_{(1-x)}Sb_{(x)}N$ is the first shell; and
$Ga_{(1-m)}Al_{(m)}As$ is the second shell.

22. The core-shell nanowire of claim 21, wherein $y = 0.03-0.07$;

$x = 0.27-0.34$; and $m = 0-0.2$.

* * * * *